United States Patent
Aviram et al.

[11] Patent Number: 5,955,242
[45] Date of Patent: Sep. 21, 1999

[54] HIGH SENSITIVITY, PHOTO-ACTIVE POLYMER AND DEVELOPERS FOR HIGH RESOLUTION RESIST APPLICATIONS

[75] Inventors: Ari Aviram, Croton-on-Hudson, N.Y.; Andrew T. S. Pomerene, New Fairfield, Conn.; David Earle Seeger, Congers, N.Y.

[73] Assignee: International Business Machines Corporation, Armonk, N.Y.

[21] Appl. No.: 08/700,348

[22] Filed: Sep. 23, 1996

[51] Int. Cl.⁶ ........................................ G03F 7/30
[52] U.S. Cl. .................... 430/296; 430/326; 430/967
[58] Field of Search .................... 430/967, 296, 430/326

[56] References Cited

U.S. PATENT DOCUMENTS

| | | | |
|---|---|---|---|
| 2,976,576 | 4/1961 | Wichterle et al. | 18/58 |
| 3,220,960 | 11/1965 | Wichterle | 260/2.5 |
| 3,535,137 | 10/1970 | Haller et al. | 117/8 |
| 3,620,726 | 11/1971 | Chu | 96/27 R |
| 3,669,660 | 6/1972 | Golda et al. | 96/33 |
| 3,758,448 | 9/1973 | Stamberger | 260/86.1 |
| 4,011,351 | 3/1977 | Gipstein et al. | 427/43 |
| 4,262,082 | 4/1981 | Rosenkranz | 430/296 |
| 4,293,636 | 10/1981 | Okuya | 430/281.1 |
| 4,355,093 | 10/1982 | Hartmann et al. | 430/275.1 |
| 4,458,008 | 7/1984 | Konstantinov et al. | 430/302 |
| 4,652,604 | 3/1987 | Walls et al. | 522/63 |
| 4,707,437 | 11/1987 | Walls et al. | 430/523 |
| 4,806,450 | 2/1989 | Hofmann et al. | 430/281.1 |
| 5,035,982 | 7/1991 | Walls | 430/331 |

(List continued on next page.)

FOREIGN PATENT DOCUMENTS

| | | | |
|---|---|---|---|
| 0674224A1 | 9/1995 | European Pat. Off. | 430/270.1 |
| 0702271A1 | 3/1996 | European Pat. Off. | 430/910 |
| 63-69786 | 9/1989 | Japan . | |

OTHER PUBLICATIONS

Method to Remove Positive Photoresist Stains from Garments, Mar. 1991, Research Disclosure n434–03–91.

Tadao et al., Photoengraving Method, Jap. 62–264053, 1987, Abstract.

RN 25249–16–5, Registry Copyright 1997 ACS, Computer Printout. 1 page.

Bohumil Bednar et al, *Resists in Microlithography and Printing*, Materials Science Monographs: 76, 2nd revised Ed, Elsevier, Amsterdam, 1993, pp. 84–86.

*Primary Examiner*—Cynthia Hamilton
*Attorney, Agent, or Firm*—Pollock, Vande, Sande & Priddy

[57] ABSTRACT

Positive lithographic patterns are produced by imagewise exposing to actinic light, x-ray or e-beam a polymer having pendant recurring groups selected from the group consisting of

$-COO-CH_2-CH(OH)-(CH_2)_x-H$ wherein x is 0–20;

$-COO-CH_2-CH(OH)-(CH_2)_y-HE-(CH_2)_z-H$; and mixtures thereof; wherein HE is O or S; and each y and z individually is 1–18; and mixtures thereof; and then developing the polymer in an aqueous base developer. The developer can be any of the conventional or commonly used ones as well as the special developers discussed below.

Positive lithographic patterns are also produced by imagewise exposing to actinic light, x-ray or e-beam a photosensitive polymeric material to provide free carboxylic acid groups; and then developing by contacting with an aqueous developer solution of about 0.001 % to about 1 % by weight of a compound containing at least one amino group and at least two sulfonate groups selected from the group consisting of alkali metal sulfonate group, ammonium sulfate group, and mixtures thereof; or developing by contacting with an amine in vapor form and contacting with an aqueous solvent.

17 Claims, 4 Drawing Sheets

U.S. PATENT DOCUMENTS

| | | | |
|---|---|---|---|
| 5,147,759 | 9/1992 | Ohtawa et al. | 430/285.1 |
| 5,155,011 | 10/1992 | Zertani et al. | 430/331 |
| 5,164,286 | 11/1992 | Blakeney et al. | 430/331 |
| 5,200,291 | 4/1993 | Wanat | 430/163 |
| 5,212,047 | 5/1993 | Hertler et al. | 430/270 |
| 5,229,245 | 7/1993 | Lin et al. | 430/190 |
| 5,368,982 | 11/1994 | Suzuki et al. | 430/256 |
| 5,374,500 | 12/1994 | Carpenter, Jr. et al. | 430/270.1 |
| 5,420,171 | 5/1995 | Unruh | 522/44 |
| 5,506,088 | 4/1996 | Nozaki et al. | 430/326 X |

HIGH SENSITIVITY, PHOTO-ACTIVE POLYMER AND DEVELOPERS FOR HIGH RESOLUTION RESIST APPLICATIONS

TECHNICAL FIELD

One aspect of the present invention relates to lithographic materials useful in device fabrication. This aspect of the invention is directed to polymer compositions that when exposed to actinic light such as UV radiation below 240 nm, or soft rays; x-ray or e-beam undergo a photochemical reaction that leads to the formation of pendant carboxylic acid groups, which are base soluble. This photochemical reaction is very efficient and can be used for high resolution positive resists. The present invention is also concerned with high sensitivity non-amplified positive working resists for deep UV lithography that are developable with bases, such as aqueous bases. The present invention is also concerned with positive resist applications in x-ray lithography and e-beam lithography.

The present invention is especially concerned with the development of patterns after exposure. The development of the patterns according to the present invention employs aqueous systems, which are desirable and preferred over organic solvent developers, especially from an ecological and environmental viewpoint.

Developers according to the present invention relate to photoresists whose performance depends on the conversion of an organic group, most commonly an ester, into a carboxylic acid group. The developers of this invention are capable of developing patterns faster and with greater reliability than commonly known developers.

BACKGROUND OF THE INVENTION

The lithographic process comprises several steps which include coating a thin film of the radiation sensitive resist onto a substrate which is selectively image-wise exposed to radiation that defines a pattern on the coating. In so doing a solubility difference is induced between the exposed and unexposed areas and the developer used in the pattern development process is capable of distinguishing between the two regions and preferentially removing one kind or the other. When the exposed areas are removed by the developer, the remaining pattern is positive while the opposite leads to negative patterns.

The manufacture of integrated circuits and other patterned devices relies primarily on resist materials that enable the formation of high resolution patterns. In the search for materials and methods for formation of patterns below 0.25 microns, it is recognized that such patterns require exposure sources based on UV radiation below 248 nm or x-ray, or e-beam. In the case of the UV radiation, it might be convenient to use excimer laser sources that produce radiation at 193 nm. Likewise, it is essential to employ resist materials suitable for use with short wavelengths sources.

It is well known in the art that the photochemical formation of carboxylic acids, be it by amplified means such as a catalytic-acidic decomposition of a tertiary butyl ester, or by the photochemical decomposition of 1,2-naphthoquinone diazides, can be employed to produce high resolution and high efficiency resists. This type of reaction is being relied upon extensively in the production of positive working resists.

An example of a positive resist suitable for short wavelength (193 nm) applications is the amplified resist described in the Journal of Vacuum Science and Technology B9 (6), p3357 (1991), by R. D. Allen et al., and also in U.S. Pat. No. 5,071,730, which describes a terpolymer based on a methacrylate backbone containing tertiary butyl esters, methyl esters or unesterified carboxylic acids side chains. Resist formulations also contain photoacid generating groups that decompose during the irradiation and cause a catalytic decomposition of the tertiary butyl esters groups, resulting in additional free carboxylic acid groups in imaged areas. These can be dissolved faster than the unexposed polymer with dilute aqueous bases. However, due to the existence of free carboxylic acid groups in non-imaged areas, the selectivity of the development is somewhat compromised.

U.S. Pat. No. 5,212,047 by Walter R. Hertler et al., assigned to E. I. Du Pont de Nemours and Co. describes another amplified resist material that provides excellent resolution and sensitivity. The composition involves polymers having recurring pendant acid labile α-alkoxyalkyl carboxylic acid ester moieties in the presence of an acid generator activated by UV, visible, x-ray or e-beam radiation. The mode of operation of this resist is similar to other amplified resists that use acid labile groups.

It is well known in the art that poly(methyl methacrylate) (PMMA) undergoes main chain scission with a low quantum yield of 0.04 to 0.14, depending on the intensity and wavelength of the radiation. Side chain scission with a minute quantum yield of $10^{-6}$ has also been reported, but is too inefficient for practical resist applications. The reported photochemistry of PMMA and its analogues, leads to solvent developable positive images and relatively low efficiency lithography. (Wayne M. Moreau, Semiconductor Lithography, p 59, Plenum Press, NY 1988).

Japanese Laid-Open Patent Application (Kodai) No. 1-244447, Sep. 28, 1989 by Nakase et al., assigned to Toshiba Corp., suggests that films of poly(2-hydroxyethyl methacrylate) and poly(2-hydroxypropyl methacrylate) can be used for pattern formation, particularly with e-beam, and developed with isopropyl acetate, an organic solvent. The mode of development of patterns therein suggests that the scission products are expected to behave in the normal mode attributable to the majority of poly acrylic and methacrylic esters, namely main chain scission.

C. F. Vernon et al. reported (Polymer International, 27, 243 (1992)), that poly(2-hydroxyethyl methacrylate) undergoes ablation when exposed with excimer laser radiation at 193 nm. Vernon et al. suggested that at high radiation fluxes (>280 mJ/sq.cm.), the polymer suffers main chain scission, while at low fluxes, scission of the entire side chain 2-hydroxyethoxycarbonyl, including the moiety —COO—, occurs, with possible production of carbon dioxide.

U.S. Pat. No. 4,707,437 by John E. Walls et al., assigned to Hoechst Celanese Corporation, suggests a radiation polymerizable composition for use in the production of photographic elements such as lithographic printing plates. The composition contains a terpolymer of vinyl acetate, vinyl alcohol and a vinyl acetal, along with a photoinitiator, a diazonium salt and a photopolymerizable mixture comprising an oligomer prepared by reacting a diisocyanate compound with ethylenically unsaturated compound such as 2-hydroxyethyl acrylate, on one side and the other with a polyester polyol. The composition is used for film coating of ammonium surfaces for preparing printing plates. When exposed, the irradiated areas photo polymerize and harden, while the unexposed areas can be removed by dissolution to form a negative image.

Concerning developers and the development process, U.S. Pat. No. 4,458,008 suggests that dyestuffs that have the capacity of dyeing cotton, and others that have capacity of dyeing synthetic fibers as well as other dyes, can enhance the development of patterns in a chalcogenide photosensitive layer, when incorporated in alkaline developing agents of the usual type. The resist described is clearly an inorganic resist.

U.S. Pat. No. 5,035,982 suggests a composition for developing negative working lithographic printing plates comprising of a mixture of alkali salts of xylene sulfonic acid together with alkali salts of mesitylene sulfonic acid and an alkanol amine.

U.S. Pat. No. 3,620,726 describes a process of using colored particles to develop photodeformations in polymer films. The colorants used are fine particles pigments. The irradiation process hardens the deformable composition, along the lines of negative working resists. Following the selective hardening step, the non-polymerized sections of the film are colored to visualize the image. However, this process was not intended to produce photolithographic images.

U.S. Pat. No. 5,368,982 suggests a developing solution containing the poly(N-vinylpyrrolidone), butyl cellosolve surfactants and water.

U.S. Pat. No. 5,278,030 suggests that ethylenediamine tetraacetic acid can improve the performance of a developer.

U.S. Pat. No. 5.200,291 suggests a negative resist formulation that contains diazonium sulfonate as the light sensitive group. After exposure, the pattern is developed in a suitable organic solvent or aqueous developers that contain alkali metasilicates, phosphates or borates.

U.S. Pat. No. 5,164,286 suggests a developer for alkali developable photoresists that contains in addition to the aqueous basic solution, an amphoteric surfactant for lowering the surface tension of the developer. The preferred surfactant has an ammonium group and a carboxylic acid group in the same molecule.

SUMMARY OF INVENTION

One aspect of the present invention relates to producing a positive lithographic pattern on a substrate comprising providing on the substrate a coating of a polymer having pendant recurring groups as follows:

1) —COO—$CH_2$—CH(OH)—$(CH_2)$ x—H wherein x is 0–20;
2) —COO—$CH_2$—CH(OH)—$(CH_2)_y$—HE—$(CH_2)_z$—H; wherein HE is O or S and each y and z individually is 1–18. Mixtures of these pendant groups can be used, if desired.

The polymer is then imagewise exposed to actinic light, x-ray or e-beam. The lithographic pattern is developed by contacting the exposed polymer with an aqueous base developer to thereby remove the portions of the polymer exposed to the actinic light, x-ray or e-beam.

Another aspect of the present invention for producing a positive lithographic pattern on a substrate by providing on the substrate a coating of photosensitive polymeric material and imagewise exposing the polymeric material to actinic light x-ray or e-beam to provide exposed portions of the polymeric material with free carboxylic acid groups. The lithographic pattern is then developed by contacting the photosensitive polymeric material with an aqueous developer solution of about 0.001% to about 1% by weight of a compound containing at least one amino group and at least two sulfonate groups selected from the group consisting of alkali metal sulfonate group, ammonium sulfonate group and mixtures to thereby remove the portions of the polymeric material exposed to the actinic group, x-ray or e-beam.

A still further aspect of the present invention for producing a positive lithographic pattern on a substrate by providing on the substrate a coating of photosensitive polymeric material and imagewise material to actinic light x-ray or e-beam to provide exposed portions of the polymeric material with free carboxylic acid groups. The lithographic pattern is developed by exposing the polymeric material to an amine in vapor form thereby converting free carboxylic acid groups to ammonium carboxylate groups. Free amine is removed and the polymeric material is contacted with an aqueous solvent to thereby remove those portions of the polymeric material exposed to the actinic light x-ray or e-beam.

BEST AND VARIOUS MODES FOR CARRYING OUT INVENTION

According to one aspect of the present invention, actinic light such as deep UV irradiation with wavelengths below 240 nm, x-ray and e-beam is used to expose certain polymers such as poly(2-hydroxyalkyl acrylates) and poly(2-hydroxyalkyl methacrylates) to deesterify, side chain pendant groups leading to free carboxylic group. This process occurs with high photo-efficiency. There is no need for any special additives to catalyze the reaction or any thermal treatment during or after the exposure. Furthermore, the resulting photo-products are soluble in aqueous bases, a highly desirable feature for a practical resists. That radiation of the polymers employed in the present invention produces free pendant carboxylic acid groups along product polymeric chains is surprising and in contrast to previous reports, as described in the prior art.

Figure 1:
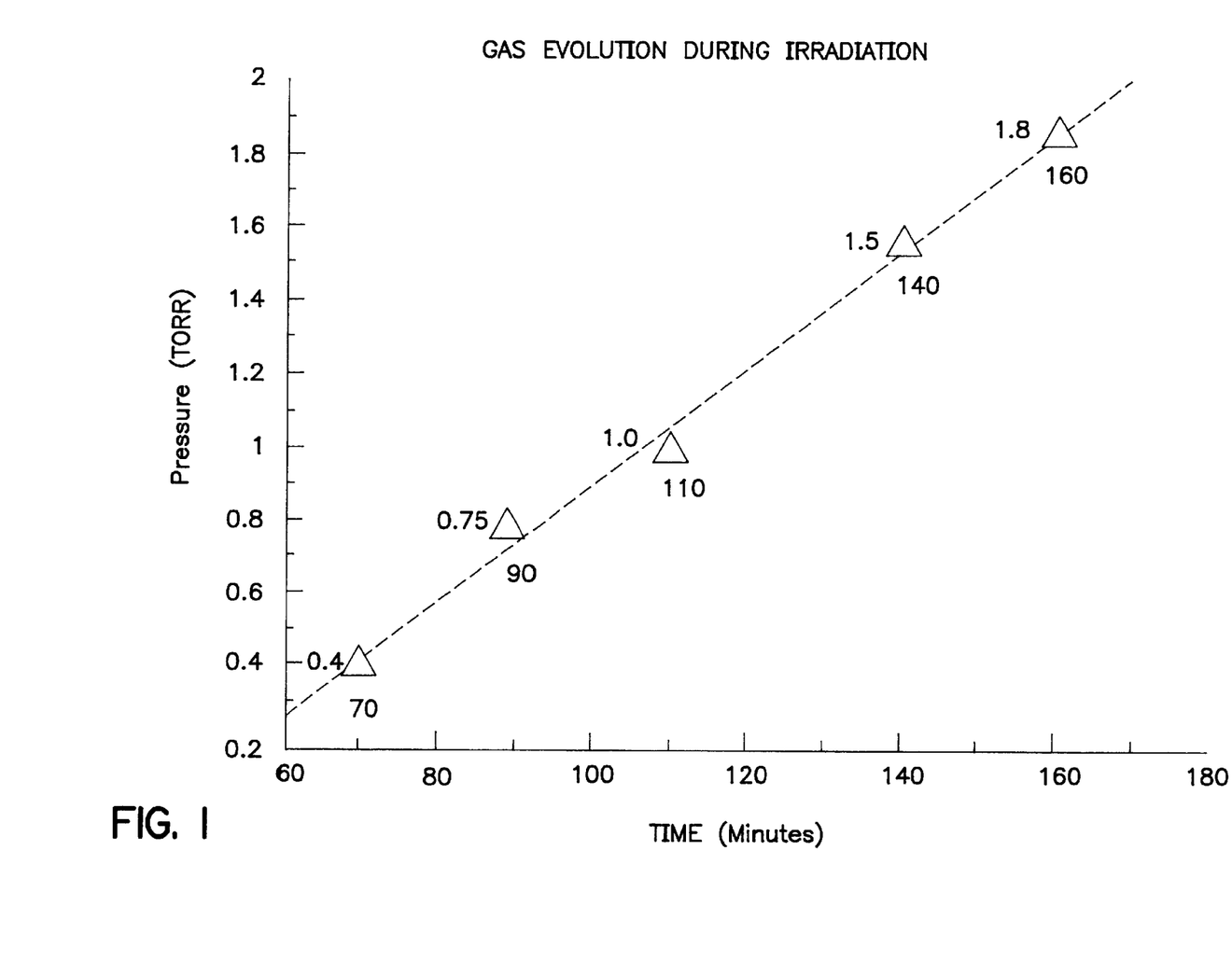
FIG. 1 is a plot of pressure increase as a function of time of exposure.

For example, FIG. 1 is a plot of pressure increase as a function of time of exposure. The pressure is a measure of the evolution gaseous products during irradiation in a closed evacuated container. As shown, the pressure inside the container increased in proportion to the time of irradiation at constant flux. This, along with chemical analysis of the functional group of the product, verify the above discussed polymer ester scission reaction.

The polymers employed according to this aspect of the presently invention contain pendant recurring groups selected from the group consisting of:

—COO—$CH_2$—CH(OH)—$(CH_2)_x$—H wherein x is an integer of 0–20;

—COO—$CH_2$—CH(OH)—$(CH_2)_y$—HE—$(CH_2)_z$—H wherein HE is O or S; and each y and z individually is 1–18; and mixtures thereof.

Preferred polymers employed according to this aspect of the present invention are poly(2-hydroxyalkyl acrylate) and poly(2-hydroxyalkyl methacrylate) polymers.

The alkyl groups are straight or branched chain saturated hydrocarbon having from 1 to 22 carbon atoms.

Some examples of these poly(2-hydroxyalkyl acrylate) and poly(2-hydroxyalkyl methacrylate) polymers are:

Poly(2-hydroxyethyl methacrylate)
Poly(2-hydroxypropyl methacrylate)
Poly(2-hydroxybutyl methacrylate)
Poly(2-hydroxypentyl methacrylate)
Poly(2-hydroxyethyl acrylate)
Poly(2-hydroxypropyl acrylate)
Poly(2-hydroxybutyl acrylate)
Poly(2-hydroxypentyl acrylate)

Other suitable homopolymers include those having as backbone a polyacrylate, a polymethacrylate, a polymaleate, and a polyvinyl alcohol.

The polymers typically have molecular weights (weight average) of about $10^4$ to about $10^6$. more typically about 50,000 to about 650,000, a particular example being about 300,000. The Tg of the polymers is typically up to about 70° C. The polymers can be prepared by polymerization of the selected monomer in an organic diluent such as isopropanol or tetrahydrofuran under reflux in a nitrogen atmosphere for about 24 hours in the presence of about 0.4% by weight of a free radical catalyst such as azoisobutyricdinitrile. The relative amount of organic diluent typically being about 20 to about 100 parts by weight per 1 part by weight of the monomer.

The polymer in the case of isopropanol is then precipitated out of solution by adding about 1 part by weight of water per 1 part of the isopropanol and then dried. In the case of tetrahydrofuran, the polymer is obtained by evaporating off the tetrahydrofuran, followed by dissolving in an alcohol such as isopropanol and then precipitating the polymer by adding water. The amount of alcohol and water typically being about 20 to about 100 parts by weight per 1 part of the starting monomer.

Typical film thicknesses of the compositions are about 0.3 to about 1 micron and more typically about 0.5 to about 1 micron (dry).

The polymer can be dissolved in an organic solvent such as dimethyformamide, perfluoroisopropanol or 1-methyl-1-pyrrolidinone. The solution can then be coated on to the desired substrate, such as by spin casting. Preferred substrates are those used in fabricating integrated circuits.

Figure 2:
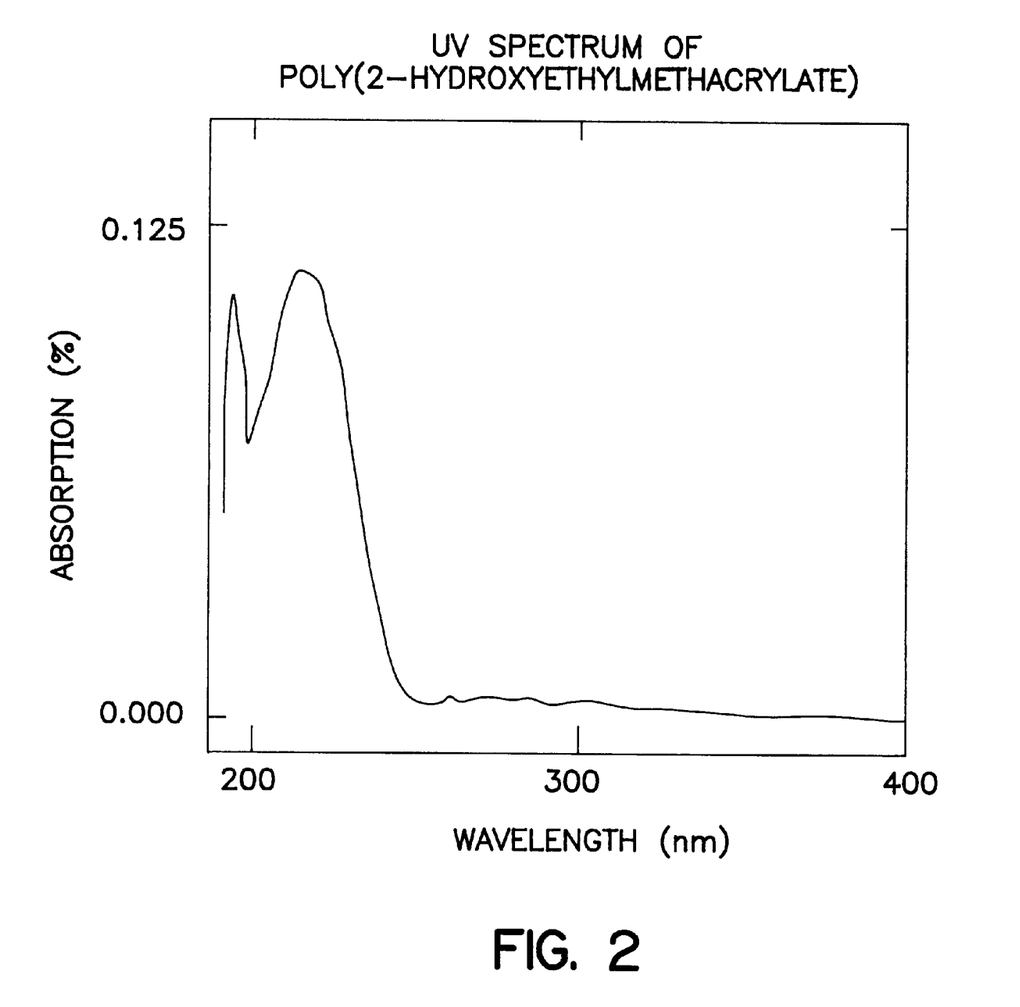
FIG. 2 is a UV absorption spectrum of a film of poly(2-hydroxyethyl methacrylate).

The polymeric film is then imagewise exposed to actinic light, x-ray or e-beam to contact selected portions of the film without exposing the other portions of the film. Preferably, the actinic light employed is preferably deep UV (i.e., wavelengths of 193 nm and below) x-rays and e-beam. For instance see FIG. 2, which is a UV absorption spectrum of a film of poly(2-hydroxyethyl methacrylate). The light absorption at 248 nm is significantly lower than at 200 nm, thus, unless properly sensitized, the β-hydroxy esters will decompose only at wavelengths lower than 240 nm, thus making the materials suitable for the 193 nm lithography.

Figure 3:
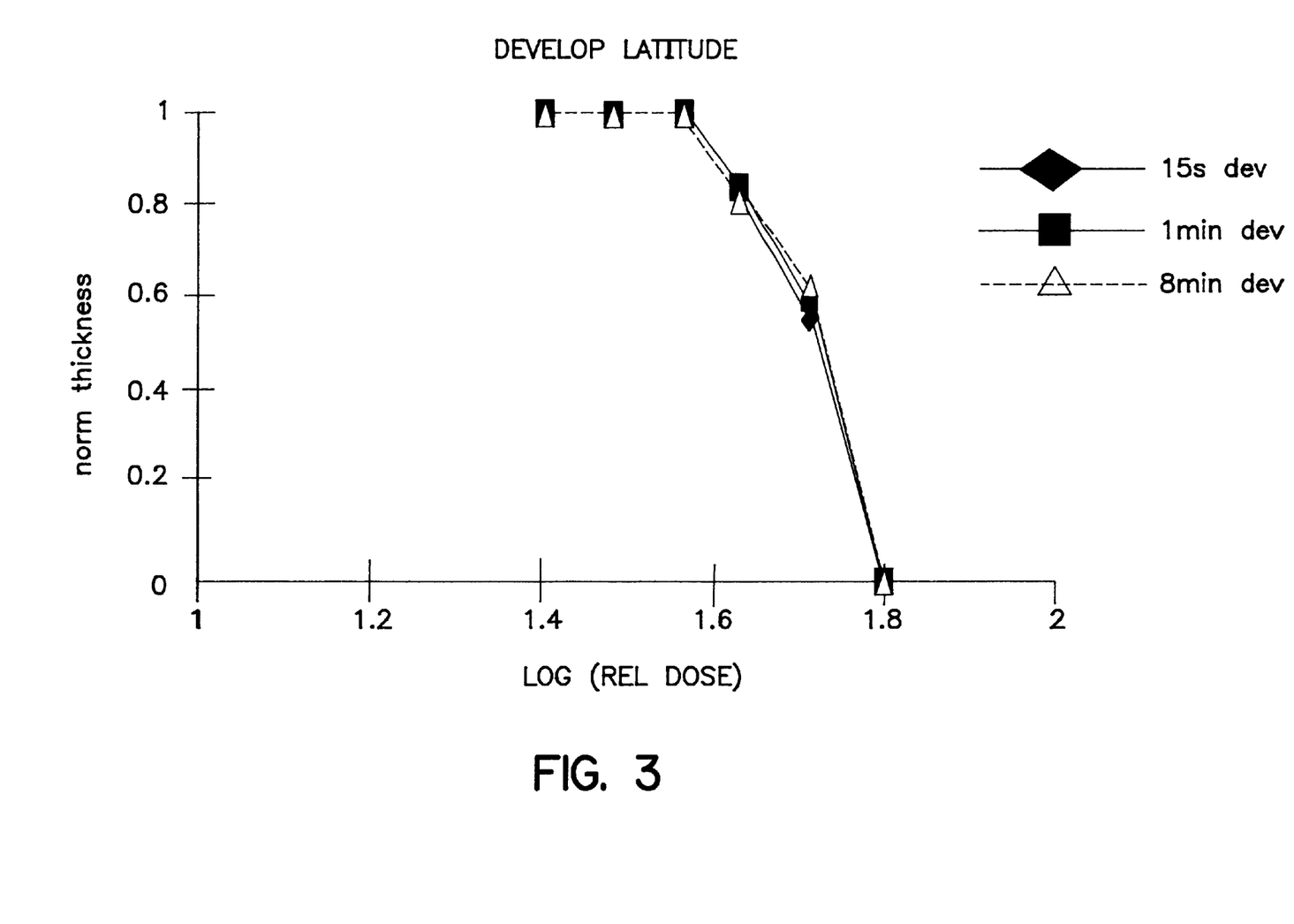
FIG. 3 is a development curve of poly(2-hydroxyethyl methacrylate) exposed with UV at 193 nm and developed with tetramethylammonium hydroxide.

A development curve of poly(2-hydroxyethyl methacrylate) exposed with UV at 193 nm and developed with tetramethylammonium hydroxide is shown in FIG. 3. The plot demonstrates high contrast of this resist. The high efficiency of the photochemical reaction makes possible the use of the polymers required by this aspect of the present invention for non-amplified resists.

The non-amplified polymeric resists employed according to the present invention, after exposure, is then developed to provide the desired pattern. The developer is an aqueous base such as ammonium hydroxide, tetramethyl ammonium hydroxide or pyridine. Suitable ammonium hydroxide compositions contain up to about 27% by weight and preferably about 3 to about 5% by weight. A suitable tetramethylammonium hydroxide composition is a 0.26N solution (AZ-300). An example of a pyridine developer is a 5% aqueous solution.

According to another aspect of the present invention, improved images with increased resolution are achieved employing preferred developers and methods as will be described hereinbelow. More specifically involved are two developers and development methods. The first method relies on aqueous solutions of certain organic materials. The other is an amine vapor developer employed by a specific technique.

The polymeric materials processed according to these developer aspects of the present invention are photosensitive polymeric materials that upon exposure to actinic light result in the presence of free carboxylic acid groups. The preferred photosensitive polymeric materials are those disclosed hereinabove concerning the first aspect of the present invention.

METHOD 1

The developers employed according to this aspect of the present invention are aqueous solutions of about 0.001% to about 1% by weight of a compound containing at least one amino group, preferably two or more amine groups, and at least two sulfonate groups selected from the group consisting of alkali metal sulfonate, ammonium sulfonate group and mixtures thereof. Contact with these developers removes the portions of the polymeric material exposed to the actinic light.

The developers are amphoteric materials and include both monomeric and polymeric materials.

Examples of specific developers are:

1. CONGO RED C.I. No. 22120

2. FLUORESCENT BRIGHTENER #28 C.I. No. 40622

3. 1,4-Pipearazinediethanesulfonate disodium salt (Sodium pipesate)

The developer can include additives such as added surfactants such as poly (sodium styrene sulfonate). When present, such is typically used in amounts of about 0.001 to about 0.5 wt. percent.

METHOD 2

According to another aspect of the present invention, an amine developer in gaseous or vapor form is employed followed by contact with water or an aqueous solvent. The contact with the amine converts free carboxylic acid groups to ammonium carboxylate groups. Free amine is then removed. The water or aqueous solvent extracts or removes those portions of the polymeric material exposed to the actinic light.

Figure 4:
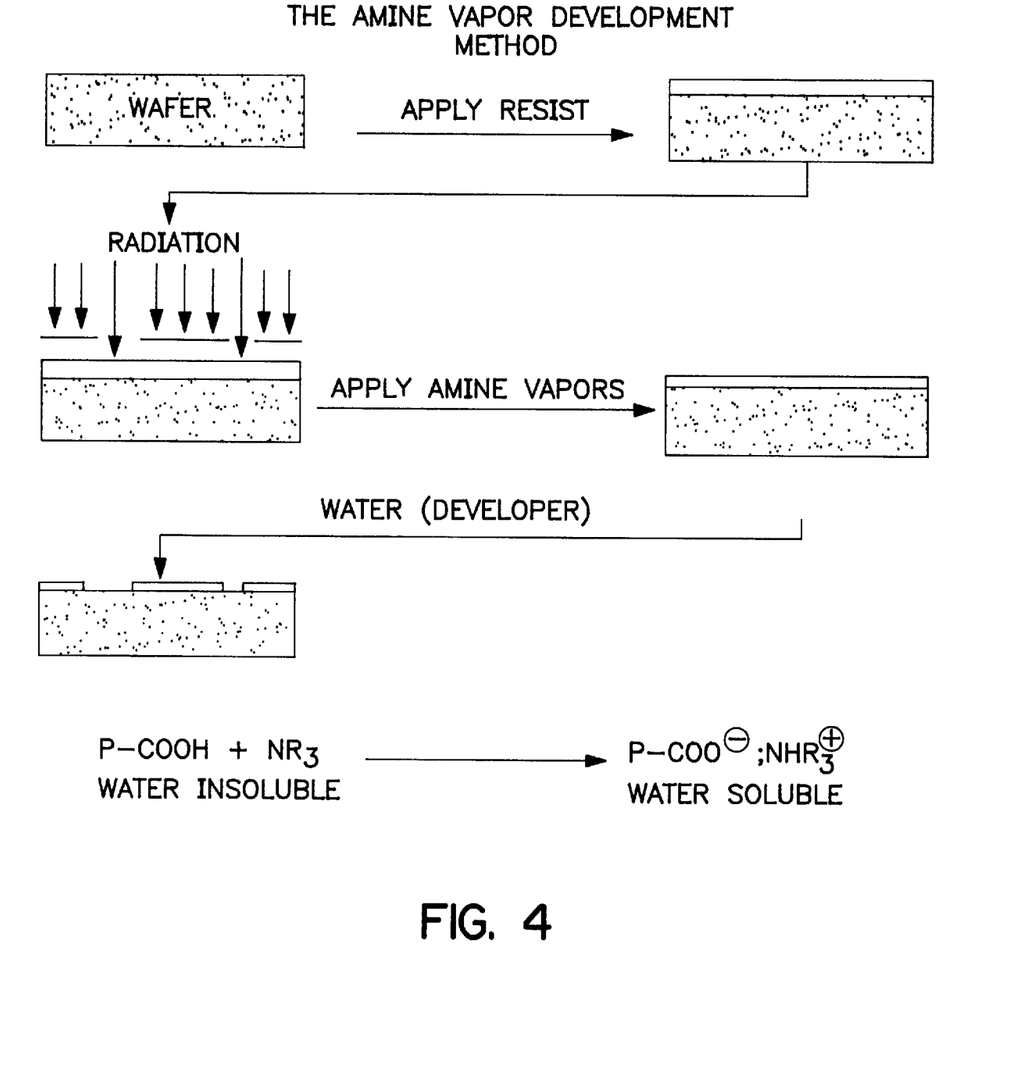
FIG. 4 is a flow chart of the amine vapor development process of the present invention.

More particularly, when a polymeric film that has been imagewise addressed is exposed to the amine vapors, these penetrate into the film and react with the carboxylic acid groups in the exposed areas. The film is then heated or placed in vacuum to expel excess unreacted amine and immersed into water or alcohol containing water, to solubilize the ammonium carboxylate containing polymer. A flow chart of the amine process is shown in FIG. 4.

Preferred amines are tertiary amines of the general formula:

wherein each of $R_1$, $R_2$ and $R_3$ is $C_nH_{2n+1}$ or $C_6H_5$ and n=1–8; and of the general formula: N,N'-tetra-R-diamino-$C_mH_{2m}$ where R=$C_nH_{2n+1}$ and where n=1–4 and m=1–8.

Examples of suitable amines are:

N,N'-tetramethyl-ethylene diamine
N,N'-tetraethyl-ethylene diamine
N,N'-tetrapropyl-ethylene diamine
N,N'-tetrabutyl-ethylene diamine The following non-limiting examples are presented to further illustrate the present invention.

EXAMPLE 1

About 12.5 g of poly(2-hydroxyethyl methacrylate) is dissolved in about 87.5 g N,N-dimethylformamide. The solution is spin coated onto a silicon wafer at 3000 RPM and given a post applied bake (PAB) of about 2 minutes at about 100° C. The resulting film is about 0.8 micrometer thick. The film is exposed through a patterned mask with a narrow band UV lamp having an output at 185–195 nm, and given a dose of 70 mJ/sq.cm. The image is developed with a solution of 0.265N tetramethylammonium hydroxide in water for eight minutes, resulting in a positive image.

EXAMPLE 2

About 12.5 g of poly(2-hydroxypropyl methacrylate) are dissolved in 87.5 g N,N-dimethylformamide. The solution is spin coated onto a silicon wafer at 3000 RPM and given a post applied bake (PAB) of about 2 minutes at about 100° C. The resulting film is about 0.8 micrometer thick. The film is exposed through a patterned mask with a narrow band UV lamp having an output at 185–195 nm, and given a dose of 70 mJ/sq.cm. The image is developed with a solution of 0.265N tetramethylammonium hydroxide in water for eight minutes, resulting in a positive image.

EXAMPLE 3

A film of poly(2-hydroxyethyl methacrylate) is prepared as described in Example 1 and exposed with 70 mJ/sq.cm. x-ray radiation through an appropriate mask. The film is developed with about 0.1 wt. % solution of congo red in water for eight minutes. A positive image is obtained.

EXAMPLE 4

A film of poly(2-hydroxypropyl methacrylate) is prepared as in Example 2 and exposed to 70 mJ/sq.cm. x-ray radiation through a suitable mask. The image is developed with a solution of about 0.2 wt. % of the dye fluorescent brightener #28 in water for eight minutes. A positive image is obtained.

EXAMPLE 5

A film of poly(2-hydroxypropyl methacrylate) is prepared as in Example 2 and exposed to 70 mJ/sq.cm. x-ray radiation through a suitable mask. The image is developed by the following amine method: The exposed wafer is placed in a closed container that includes an open bottle of N,N,N',N'-tetramethylethylenediamine, The vapor contact is maintained at room temperature for 12 hours. (The time and temperatures are dependent on the dimensions of the container). The excess vapors are removed by vacuum. The film is placed in a solution of 15 wt. % of isopropanol in water. A positive image is obtained.

EXAMPLE 6

A film of poly(2-hydroxypropyl methacrylate) is prepared as in Example 2 and then exposed to 8 µC (microcoulombs)

electron beam at 100 kv to form a pattern. The wafer is developed by the amine method described in the previous example and a positive image is obtained.

EXAMPLE 7

A film of poly(2-hydroxypropyl methacrylate) is prepared as in Example 2 and then exposed to 8 $\mu$C electron beam at 100 kv to form a pattern. The wafer is developed with a solution of about 0.2 wt. % of the dye fluorescent brightener #28 in water for eight minutes. A positive image is obtained.

What is claimed is:

1. A process for producing a positive lithographic pattern on a substrate which comprises:
    a. providing on said substrate a non-amplified coating consisting essentially of a polymer having pendant recurring groups selected from the group consisting of —COO—CH$_2$—CH(OH)—(CH$_2$)$_x$—H wherein x is 0–20; —COO—CH$_2$—CH(OH)—(CH$_2$)$_y$—HE—(CH$_2$)$_z$—H; and mixtures thereof; wherein HE is O or S; and each y and z individually is 1–18;
    b. imagewise exposing said polymer to actinic light, x-ray or e-beam; and
    c. developing said lithographic pattern by contacting said polymer with an aqueous base developer to thereby remove the portions of said polymer exposed to said actinic light, x-ray or e-beam.

2. The process of claim 1 wherein the hydroxyl group of said polymer is in the β position.

3. The process of claim 1 wherein the polymer is poly(2-hydroxyethyl methacrylate).

4. The process of claim 1 wherein the polymer is poly(2-hydroxypropyl methacrylate).

5. The process of claim 1 wherein the polymer is poly(2-hydroxybutyl methacrylate).

6. The process of claim 1 wherein the polymer is poly(2-hydroxypentyl methacrylate).

7. The process of claim 1 wherein the polymer is poly(2-hydroxyethyl acrylate).

8. The process of claim 1 wherein the polymer is poly(2-hydroxpropyl acrylate).

9. The process of claim 1 wherein the polymer is poly(2-hydroxybutyl acrylate).

10. The process of claim 1 wherein the polymer is poly(2-hydroxypentyl acrylate).

11. The process of claim 1 wherein said actinic light is deep UV irradiation with wavelengths shorter than 240 nm.

12. The process of claim 1 wherein x-ray irradiation is employed.

13. The process of claim 1 wherein e-beam irradiation is employed.

14. The process of claim 1 wherein said polymer contains a backbone selected from the group consisting of polyacrylate, polymethacrylate, polymaleate, and polyvinyl alcohol.

15. The process of claim 1 wherein said developer is an aqueous solution of a material selected from the group consisting of ammonium hydroxide, tetramethyl ammonium hydroxide and pyridine.

16. The process of claim 1 wherein said polymer material is selected from the group consisting of poly(2-hydroxyethyl methacrylate), poly(2-hydroxypropyl methacrylate), poly(2-hydroxybutyl methacrylate), poly(2-hydroxypentyl methacrylate), poly(2-hydroxyethyl acrylate), poly(2-hydroxypropyl acrylate), poly(2-hydroxybutyl acrylate), poly(2-hydroxypentyl acrylate), and mixtures thereof.

17. The process of claim 1 wherein said actinic radiation is deep UV irradiation with wavelengths at or shorter 193 nm.

* * * * *